United States Patent [19]

Hosaka et al.

[11] Patent Number: 5,622,566
[45] Date of Patent: Apr. 22, 1997

[54] FILM-FORMING APPARATUS

[75] Inventors: Atsushi Hosaka, Yamanashi-ken; Mitsuaki Iwashita, Nirasaki; Toshiharu Nishimura, Koufu, all of Japan

[73] Assignee: Tokyo Electron Limited, Tokyo, Japan

[21] Appl. No.: 424,473

[22] PCT Filed: Sep. 16, 1994

[86] PCT No.: PCT/JP94/01526

§ 371 Date: May 10, 1995

§ 102(e) Date: May 10, 1995

[87] PCT Pub. No.: WO95/08185

PCT Pub. Date: Mar. 23, 1995

[30] Foreign Application Priority Data

Sep. 16, 1993 [JP] Japan .................................. 5-255051

[51] Int. Cl.$^6$ .................................................. H01L 21/00
[52] U.S. Cl. .................... 118/723 VE; 118/725; 118/723 MP; 118/723 ER
[58] Field of Search ............... 118/715, 723 VE, 118/723 MP, 723 ER, 728, 729, 730

[56] References Cited

U.S. PATENT DOCUMENTS

| | | | |
|---|---|---|---|
| 4,612,207 | 9/1986 | Jansen | 118/723 E |
| 5,217,560 | 6/1993 | Kurono et al. | 118/723 ER |
| 5,252,133 | 10/1993 | Miyazaki et al. | 118/730 |
| 5,364,488 | 11/1994 | Minato et al. | 118/723 ER |
| 5,383,984 | 1/1995 | Shimada et al. | 118/723 ER |

FOREIGN PATENT DOCUMENTS

| | | |
|---|---|---|
| 58-64024 | 4/1983 | Japan . |
| 61-191015 | 8/1986 | Japan . |
| 62-3575 | 1/1987 | Japan . |
| 63-29405 | 6/1988 | Japan . |
| 3-263821 | 11/1991 | Japan . |

*Primary Examiner*—R. Bruce Breneman
*Assistant Examiner*—Felisa Garrett
*Attorney, Agent, or Firm*—Oblon, Spivak, McClelland, Maier & Neustadt, P.C.

[57] ABSTRACT

A film-forming apparatus for forming an impurity-doped film on an object such as a semiconductor wafer has an elongated reaction tube located such that its longitudinal direction is identical to the vertical direction, and having an object arrangement region in which a plurality of objects or semiconductor wafers to be processed can be arranged at intervals in the vertical direction. A film-forming gas is introduced into the reaction tube through a film-forming gas introduction pipe. This apparatus also has a main dopant gas introduction pipe, having a gas outlet located below the object arrangement region in the reaction tube, for introducing a dopant gas into the reaction tube and guiding the same upward, at least one sub dopant gas introduction pipe, having a gas outlet located above the object arrangement region in the reaction tube, for introducing the same dopant gas as the first-mentioned one into the reaction tube so as to compensate for insufficient supply of the dopant gas through the main dopant gas introduction pipe, an exhaustion system for exhausting the gases in the reaction tube, and a heating unit for heating the interior of the reaction tube.

10 Claims, 5 Drawing Sheets

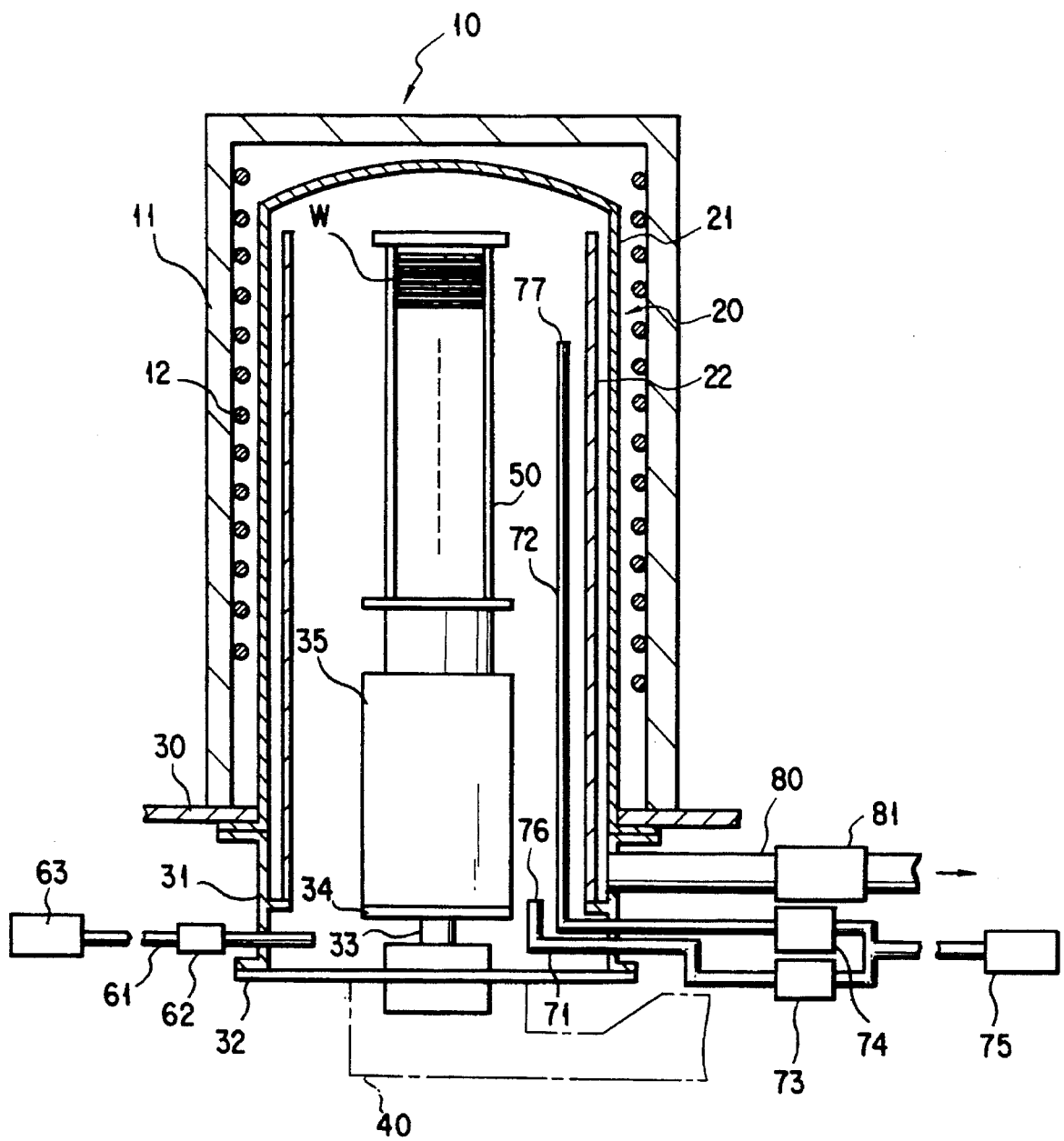
F I G. 2

FILM-FORMING APPARATUS

TECHNICAL FIELD

The present invention relates to a film-forming apparatus for forming a film doped with an impurity (e.g. phosphorus) in a process for manufacturing, for example, a semiconductor device.

BACKGROUND ART

In semiconductor devices, polysilicon films are widely used to form the gate electrodes of transistors, etc. In a deep sub-micron area of a highly-integrated semiconductor device, in particular, a highly reliable technique is required, for example, to bury an electrode in a contact hole, and polysilicon films are indispensable to such a technique. The polysilicon films are generally doped with impurities.

In light of the above, further development of methods for doping polysilicon films with impurities is being demanded.

Conventional methods for forming a polysilicon film doped with e.g. phosphorus (P) include a method for implanting P into a polysilicon film by ion implantation and annealing the film, and a method for forming a $P_2O_5$ film on a polysilicon film with the use of $POCl_3$ gas and then subjecting the resultant to a diffusion treatment. Moreover, the "in-situ method" is known as a method using HOT-WALL-type vacuum CVD.

The method for injecting phosphorus by ion injection, however, has the drawback that the crystal of the polysilicon film may be broken by the shock of ion implantation. Further, the method using $POCl_3$ gas has the drawback that the concentration of diffused impurity is not uniform in the depth direction, and a process for removing the $P_2O_5$ surface film is necessary, which complicates the manufacture of the device.

On the other hand, the in-situ method does not have the above-described drawbacks, and has the advantage that the concentration of phosphorus in a thin film can be controlled by adjusting the flow of a dopant gas. Therefore, the in-situ method is widely employed as an effective method for forming a polysilicon film.

Referring to FIG. 1, the in-situ method will be explained. FIG. 1 is a cross sectional view, showing a film-forming apparatus employed in effecting the in-situ method. A heating furnace 1 has a heater 3, and a reaction tube 2 of a double-tube structure is located in the furnace. A manifold 5 equipped with film-forming gas inlet pipe 6, a dopant gas inlet pipe 7 and an exhaustion pipe 8 is located on the lower end of the reaction tube 2. In the film-forming apparatus, a wafer boat 4 in which a plurality of wafers w, e.g. 100 wafers are mounted, is transferred into the reaction tube 2 from its lower opening, using a boat elevator 9. Thus, the wafers W are loaded in the tube. Before loading the wafers W, the reaction tube 2 is heated to a predetermined temperature. Then, gas exhaustion is performed so as to reduce the pressure in the reaction tube 2 to a predetermined vacuum value. At the same time, a film-forming gas as a mixture of monosilane ($SiH_4$) gas or disilane ($Si_2H_6$) gas and a diluent gas such as helium (He) gas is supplied into the reaction tube 2 through a film-forming gas introduction pipe 6, while a dopant gas as a mixture of phosphin ($PH_3$) gas and a diluent gas such as helium (He) gas is supplied into the reaction tube 2 through a dopant gas introduction pipe 7. Thus, a thin film is formed on the surface of each wafer W as a result of gas phase reaction.

Recently, the allowable range of the quality or thickness of such a film has been narrowed in accordance with the advance in refining a device or enhancing the reliability of the same. In the in-situ method, too, higher uniformity has been required in the in-plane film quality or thickness of each wafer, or in film quality or thickness between wafers arranged in the longitudinal direction of the reaction tube. To meet the requirement, control of the reaction temperature by providing a heater 3 of a division type around the reaction tube 2 or varying the temperature of the reaction tube 2 in its longitudinal direction has been performed so as to enhance the uniformity in the in-plane film quality or thickness of each wafer.

However, since in the above-described methods, phosphorus is supplied into the reaction tube 2 through the dopant gas introduction pipe 7 located at a lower end portion of the tube 2, the gas is consumed on wafers while it flows upward. As a result, the concentration of phosphorus contained in the gas becomes lower as the gas reaches a higher portion of the tube 2, and the uniformity in the concentration of phosphorus deposited on wafers is degraded, inevitably reducing the yield of products.

To solve this problem, the present inventors examined whether or not an L-shaped dopant gas introduction pipe is effective which is bent upward so that its upper portion can be located at an upper portion of the wafer boat, and has a plurality of gas outlets. In this case, however, there is a pressure difference between gas discharged through a gas outlet formed in a lower portion of the gas introduction pipe, and gas discharged through a gas outlet formed in an upper portion of the same. In other words, gas flows at different speeds in different portions of the tube. To avoid this, it was found necessary to appropriately vary the diameter of each gas outlet or the distance between each pair of adjacent gas outlets must be varied appropriately. However, it is very difficult to do so. In addition, after the film-forming treatment, the gas introduction pipes are cleaned, using hydrofluoric acid which can dissolve a metal constituting the pipes. Therefore, the diameter, etc., of each gas outlet may well be varied.

DISCLOSURE OF THE INVENTION

This invention has been developed in light of the above-described circumstances, and the object thereof is to provide a film-forming apparatus capable of forming, on objects, impurity-doped films of a uniform impurity concentration.

According to the present invention, there is provided a film-forming apparatus comprising: an elongated reaction tube having an object arrangement region in which a plurality of objects to be processed can be arranged in a longitudinal direction of the tube; a film-forming gas introduction pipe for introducing a film-forming gas into the reaction tube; a main dopant gas introduction pipe, having its gas outlet located in the reaction tube closer to a longitudinal end of the reaction tube than the object arrangement region, for introducing a dopant gas into the reaction tube and guiding the same toward another longitudinal end of the reaction tube; at least one sub dopant gas introduction pipe having a gas outlet located in the reaction tube closer to the other longitudinal end of the reaction tube than the gas outlet of the main dopant gas introduction pipe, for introducing the same dopant gas as the first-mentioned one into the reaction tube so as to compensate insufficient supply of the dopant gas mixture through the main dopant gas introduction pipe; exhaustion means for exhausting the gases in the reaction tube; and heating means for heating the interior of the reaction tube; wherein a film doped with an impurity is formed on each of the objects.

In a film-forming apparatus of this type, in general, impurity-doped thin films are formed by simultaneously supplying a film-forming gas and a dopant gas into the reaction tube and guiding them from an end of the reaction tube to the other end. If the dopant gas is supplied through a main dopant gas introduction pipe at a flow which determines the impurity concentration, the amount of the dopant gas is smaller than a predetermined value at the other end of the reaction tube, since part of the dopant gas is consumed while the gas flows upward. To avoid this, the present invention employs at least one sub dopant gas introduction pipe for compensating insufficient supply of the gas, thereby enhancing the degree of uniformity in the impurity concentration between the objects placed in the object arrangement region.

BRIEF DESCRIPTION OF THE DRAWINGS

FIG. 2 is a cross sectional view, showing a film-forming apparatus according to an aspect of the invention;

BEST MODE OF CARRYING OUT THE INVENTION

Figure 1:
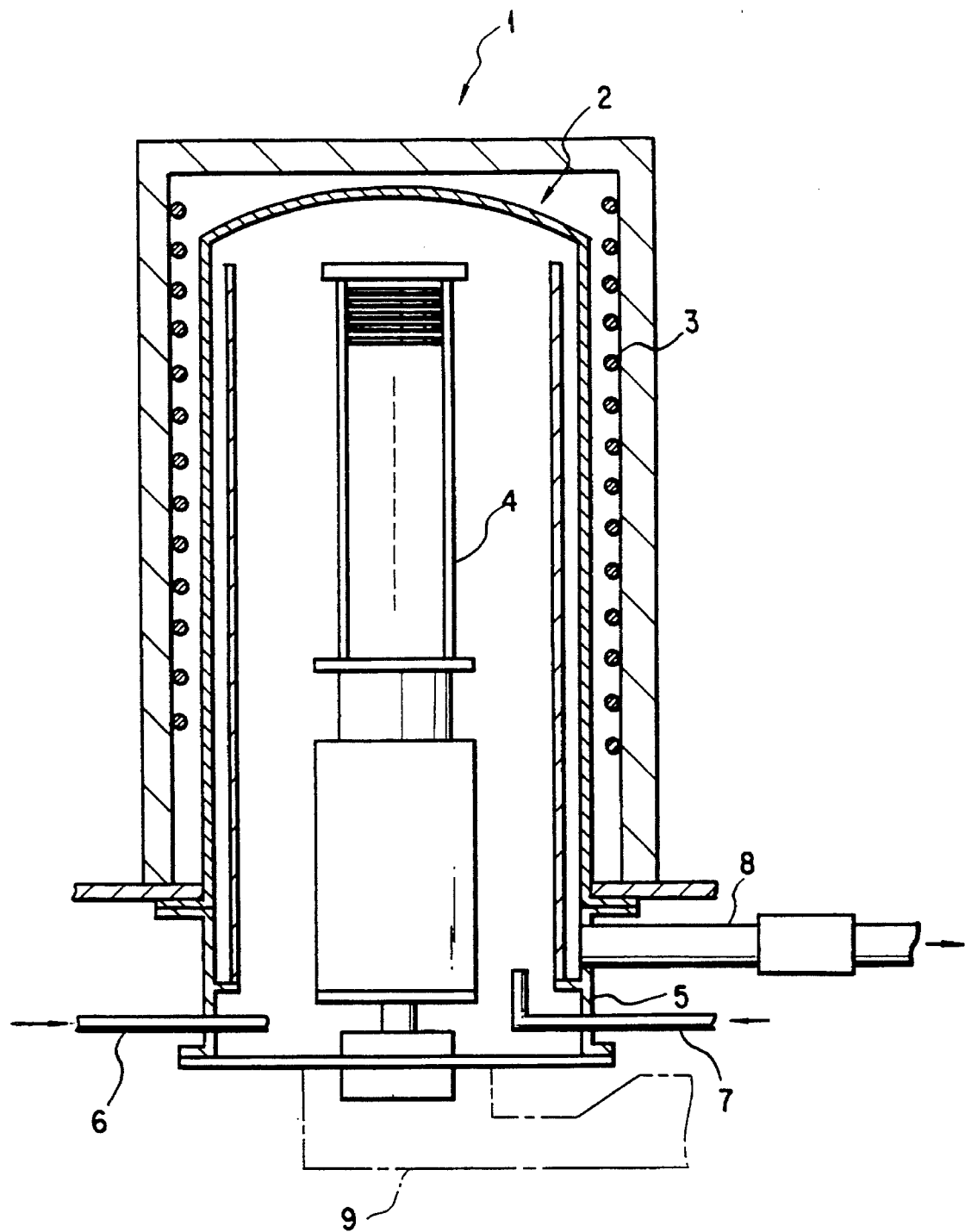
FIG. 1 is a cross sectional view, showing a conventional film-forming apparatus.

FIG. 2 is a cross sectional view, showing a film-forming apparatus according to an aspect of the invention. A heating furnace 10 is placed on a base plate 30, and has a heat-insulating member 11 and a heater 12 surrounding a reaction tube 20 (which will be explained later).

The heating furnace 10 contains a reaction tube 20 of a double-tube structure, which is equipped with an outer tube 21 made, for example, of quartz and having a closed upper end, and an inner tube 22 concentric with the outer tube 21 and made, for example, of quartz. The outer and inner tubes 21 and 22 communicate with each other. A processing atmosphere is kept in the tubes for performing a predetermined film-forming process.

The lower end of each of the outer and inner tubes 21 and 22 are held by a cylindrical manifold 31 made of stainless steel, etc. An openable cap portion 32 is secured to the lower opening of the manifold 31, thereby sealing the lower opening in an airtight manner.

A rotary shaft 33 which can be rotated, for example, by a magnetic seal in an airtight state is inserted through a center portion of the cap portion 32. The rotary shaft 33 has its lower end coupled with a rotary mechanism (not shown) of an elevator 40, and its upper end secured to a turn table 34. A wafer boat 50, which has a height of e.g. 800 mm and serves as a holder of the object to be treated, is mounted above the turn table 34 with a heat insulation cylinder 35 interposed therebetween. The wafer boat 50 can contain, for example, 150 semiconductor wafers w arranged at regular intervals.

A film-forming gas introduction pipe 61 is horizontally inserted through a lower side portion of the manifold 31 for introducing into the reaction tube 20 a film-forming gas such as monosilane ($SiH_4$) gas or disilane ($Si_2H_6$) gas in the state of for example, a gas mixture with a carrier gas such as helium (He) gas. The pipe 61 is connected to a film-forming gas supply source 63 via a mass-flow controller 62.

A main dopant gas introduction pipe 71 and a sub dopant gas introduction pipe 72 are inserted through lower side portions of the manifold 31 for introducing into the reaction tube 20 a mixture of phosphin ($PH_3$) gas and a carrier gas such as helium (He) gas. The main and sub dopant gas introduction pipes 71 and 72 are connected to a common gas supply source 75 via mass-flow controllers 73 and 74, respectively.

The main dopant gas introduction pipe 71 is bent upward in the reaction tube 20 in an L-shaped manner, and has a gas outlet 76 located at a lower portion of the reaction tube 20 than the wafers w arranged in the wafer boat 50, for example, located in the vicinity of the lower end of the heat insulation cylinder 35. Further, the sub dopant gas introduction pipe 72 is bent also in an L-shaped manner such that its gas outlet 77 opens at the upper portion of the arrangement region of the wafers W.

The lengths of the gas introduction pipes are set in accordance with the size of the reaction tube 20, the number of wafers to be processed at a time, or a scheduled concentration of phosphorus in each thin film. In this embodiment, the vertical portion of the main dopant gas introduction pipe 71 is set to have a length of e.g. 50 mm, while the vertical portion of the sub dopant gas introduction pipe 72 is set to have a length of e.g. 700 mm. As a result, the gas outlet 77 of the sub dopant gas introduction pipe 72 is positioned in the vicinity of the tenth wafer from the above.

An exhaustion pipe 80 is inserted through an upper side portion of the manifold 31 for exhausting the process gas mixture through a clearance between the outer and inner tubes 21 and 22 so as to keep the interior of the reaction tube 20 under a predetermined vacuum pressure. The exhaustion pipe 80 is connected to a vacuum pump 81.

In the film-forming apparatus constructed as above, first, the atmosphere of the reaction tube 20 is heated by the heater 12 so that a vertically center portion of the wafer boat 50 can have a predetermined temperature, for example, of 600° C., and then the wafer boat 50 having 150 wafers W arranged with a pitch of e.g. 4.76 mm is loaded into the reaction tube 20 from its lower opening.

Subsequently, the pressure in the reaction tube 20 is reduced to a predetermined vacuum value, for example, of $1 \times 10^{-3}$ Torr. Then, 100% monosilane gas as a film-forming gas containing the main component of a thin film is supplied at a flow of 1000 SCCM from the film-forming gas supply source 63 into the inner tube 22 through the film-forming gas introduction pipe 61, while a mixture, for example, of 1% phosphin gas as a dopant gas and helium gas as a diluent gas is supplied into the reaction tube 20 through the main and sub dopant introduction pipes 71 and 72. The gas mixture in the reaction tube 20 is exhausted such that the pressure therein is reduced to 0.5 Torr. Thereafter, the film-forming processing is performed for 30 minutes while rotating the wafer boat 50 at e.g. 1 to 3 rpm.

The flows of gases supplied through the main and sub dopant gas introduction pipes 71 and 72 are controlled by the mass-flow controllers 73 and 74, respectively. The flow of the dopant gas mixture from the main dopant gas introduction pipe 71 determines the concentration of phosphorus (dopant) contained in each thin film. While the dopant gas mixture is supplied through the main dopant gas introduction pipe 71, the flow of the dopant gas mixture from the sub dopant gas introduction pipe 72 is controlled so as to compensate for the insufficient dopant concentration of a thin film formed on a semiconductor wafer positioned in an upper portion of the inner tube 22, thereby making the thin film have a predetermined dopant concentration.

The gas supply amounts are determined on the basis of the size of the reaction tube 20, the lengths of the vertical portions of the main and sub dopant gas introduction pipes 71 and 72, and the phosphorus concentration of the thin film. In this case, the main and sub dopant gas introduction pipes 71 and 72 are set to supply gases at the flows of 200 cc/min. and 30 cc/min., respectively.

After the above film-forming processing, the atmosphere of nitrogen ($N_2$) in the same furnace or another is heated to 900° C., thereby annealing the resultant wafers for a predetermined time period of e.g. 30 minutes to form a polysilicon film doped with phosphorus.

As described above, the film-forming apparatus according to one aspect of the invention employs the main and sub dopant gas introduction pipes 71 and 72 having gas outlets located at lower and upper portions of the reaction tube, respectively, which enables the sub pipe 72 to compensate for the insufficient flow of the main pipe 71.

The insufficiency occurs for the following reason: The dopant gas discharged from the gas outlet of the main dopant gas introduction pipe 71 has its flow rate reduced while it flows upward in the reaction tube 20, since the gas is partially used to form a film on each wafer on its midway. Thus, the flow of the gas supplied from the main pipe 71 is lower at an upper portion of the reaction tube 20 than at a lower portion of the same. The flow at an upper portion is so small that a predetermined dopant concentration is not obtained.

The supply of a small amount of dopant gas from that gas outlet of the sub dopant gas introduction pipe 72 which is located at an upper portion of the reaction tube 20 compensates for the insufficient flow of the dopant gas mixture from the main dopant gas introduction pipe 71 at the upper portion, thereby relaxing the ununiformity of the flow of the dopant gas in the longitudinal direction of the reaction tube 20, which will occur in the case of using only the main dopant gas introduction pipe 71. As a result, the impurity concentrations of the thin films of wafers are highly uniform. Further, the predetermined impurity concentration can be obtained in a wide range of the reaction tube 20, and therefore the yield of products is enhanced.

In accordance with the development of micro-patterning of semiconductor devices, it is very advantageous to use the above-described thin films, having a highly uniform phosphorus concentration, as, for example, resistor elements which have been required to be made of very thin films and have impurity concentrations falling in a very narrow range.

Explanations will now be given of the actual experiments concerning the film-forming processing of wafers, which were performed using the above-described film-forming apparatus so as to confirm the advantage of the apparatus. In the experiments, the lengths of the vertical portions of the main and sub dopant gas introduction pipes 71 and 72 were set to 50 mm and 700 mm, respectively. The gas outlet of the sub pipe 72 was located in the vicinity of the tenth wafer from the above. The interior of the reaction tube 20 was heated to about 580° C. Monosilane gas was introduced at a flow of 1300 SCCM into the reaction tube 20 through the film-forming gas introduction pipe, and at the same time, phosphin gas was introduced into the tube 20 at flows of 200 SCCM and 30 SCCM through the main and sub dopant gas introduction pipes 71 and 72, respectively. The pressure in the reaction tube 20 was set to 0.5 Torr, and the rotational speed of the wafer boat was 1 rpm. Under the above circumstances, the film-forming treatment was performed for 45 minutes.

Thereafter, nitrogen gas and oxygen gas were supplied into the reaction tube at flows of 20 SLM and 1 SLM, respectively, thereby annealing the resultant wafers at a temperature of 850° C. for 60 minutes. The wafer boat contained 150 wafers. 15 wafers included in the 12th one through the 64th one, the 90th one and the 116th one of the 150 wafers from the above were selected. As regards these wafers, the concentration of phosphorus before the annealing was measured. Further, as regards the 12th one, the 38th one, the 64th one, the 90th one and the 116th one from the above, the film thickness and the seat resistance after the annealing were measured. The phosphorus concentration was measured five times, and each of the film thickness and the seat resistance was measured nine times.

Figure 3:
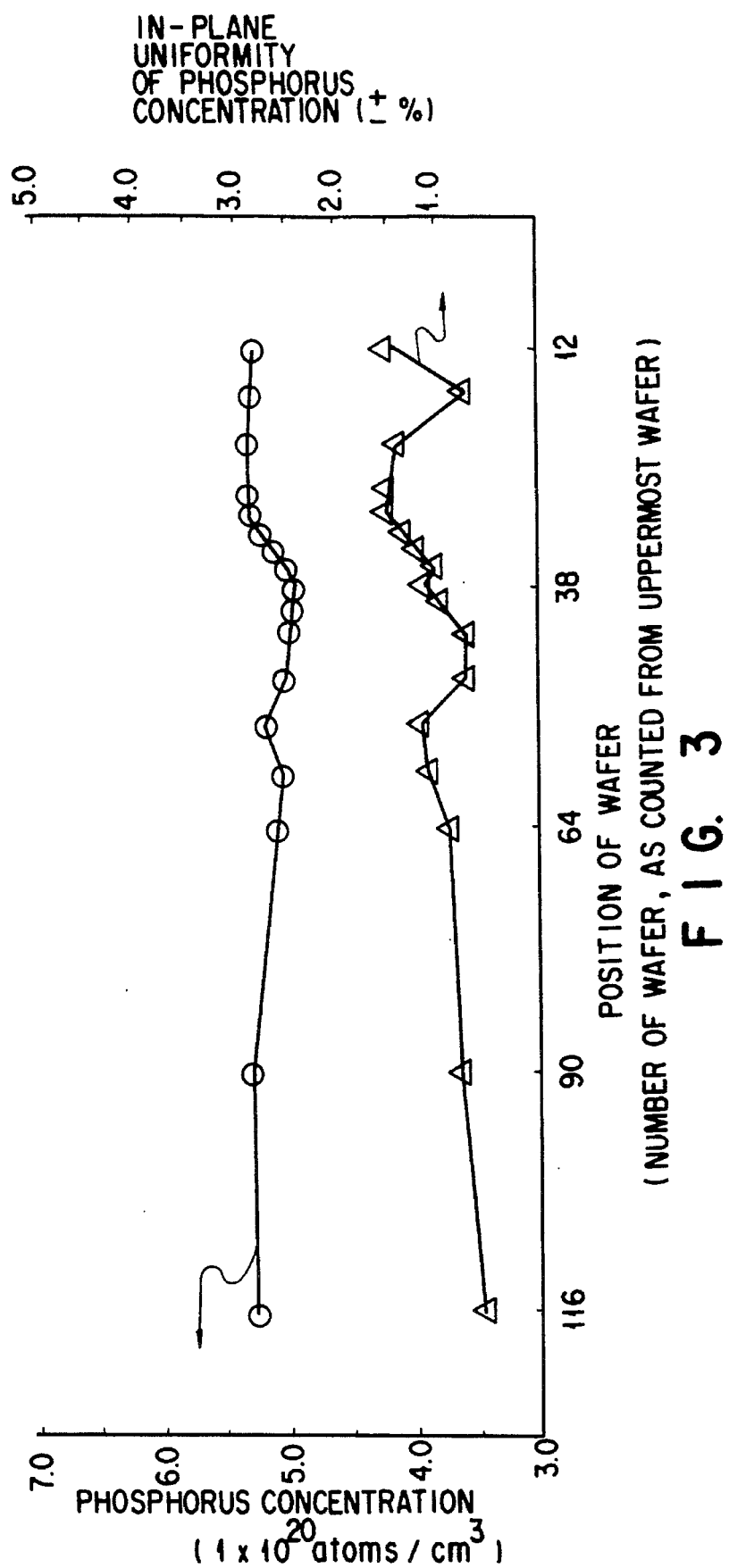
FIG. 3 is a graph, showing the results of experiments performed to confirm the advantage of the film-forming apparatus of the invention.

FIG. 3 shows the measurement results concerning the phosphorus concentration. Specifically, FIG. 3 shows the relationship between the position of a wafer and the phosphorus concentration of a thin film on the wafer. In FIG. 3, ○ represents the phosphorus concentration, and Δ the in-plane uniformity of the phosphorus concentration.

Figure 4:
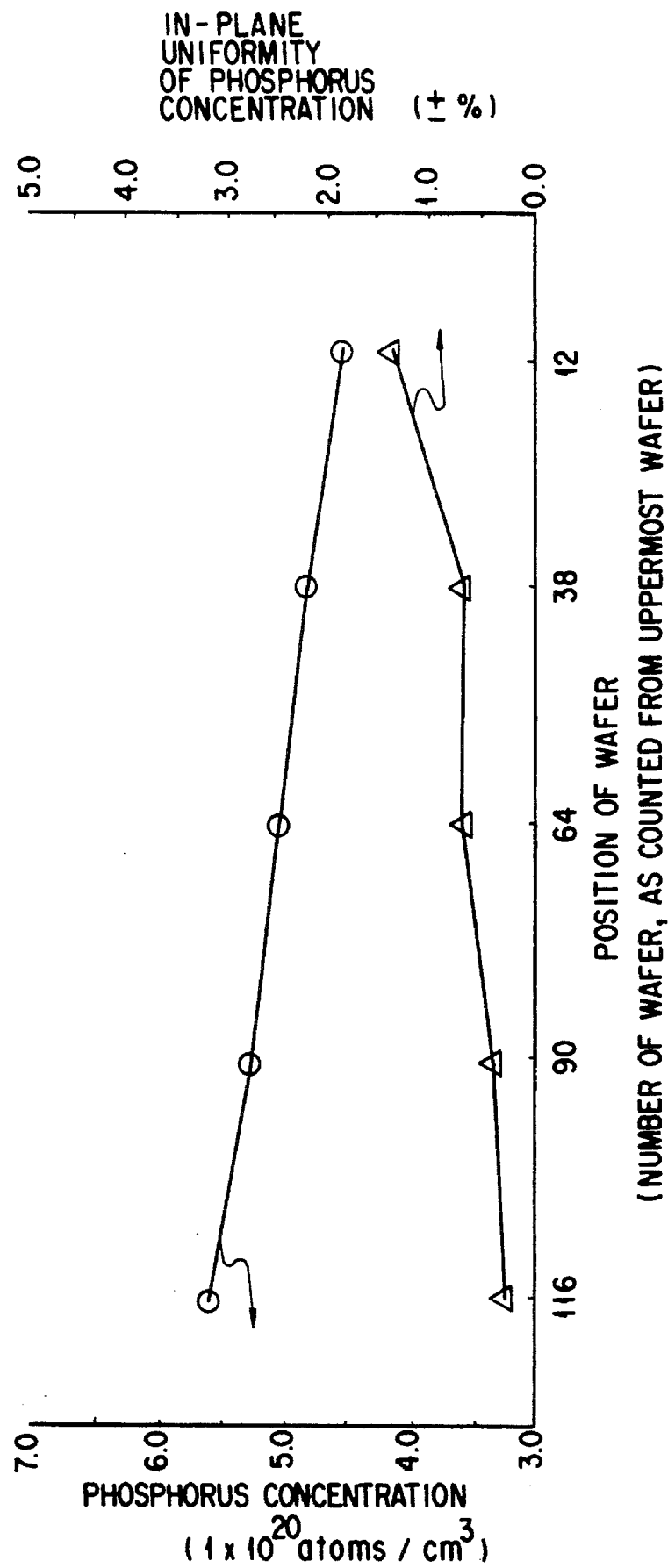
FIG. 4 is a graph, showing the results of experiments performed for comparison with the use of the conventional film-forming apparatus.

FIG. 4 shows the results of experiments performed in comparison with the FIG. 3 experiments. In the FIG. 4 case, the same experiments as above were performed by the conventional film-forming apparatus with respect to the 12th one, the 38th one, the 64th one, the 90th one and the 116th one of the wafers from the above. As a result of comparison of the experiment results of the FIGS. 3 and 4, the following is understood:

In the FIG. 4 case, the higher the position Of the wafer in the reaction tube, the lower the phosphorus concentration. On the other hand, in the FIG. 3 case, the phosphorus concentration is substantially constant irrespective of the position of the wafer. This indicates that in the conventional apparatus, the higher the portion of the reaction tube, the lower the phosphorus concentration. On the other hand, the phosphorus concentration is substantially constant in the overall reaction tube.

From the experiment result, the following fact has been confirmed. When, in accordance with the present invention, the main dopant gas introduction pipe having a short vertical portion and the sub dopant gas introduction pipe having a long vertical portion are provided, and the flows of a dopant gas from the main and sub pipes are controlled such that the dopant gas of an amount required to determine the phosphorus concentration of each wafer can be supplied into the reaction tube from the main pipe, and that the dopant gas of an amount required to compensate an insufficient phosphorus concentration at an upper portion of the reaction tube can be supplied into the reaction tube from the sub pipe, the dopant gas can be supplied uniformly in the reaction tube, thus the phosphorous concentration of thin films of wafers can be highly uniform.

Further, as regards the film thickness of each wafer, the average film thickness of each of the 12th one, the 38th one, the 64th one, the 90th one and the 116th one of the wafers from the above was calculated, and the average value of the average film thicknesses was calculated. As a result, the average value of the film thicknesses of the wafers was 1663Å, and the degree of variations in average film thickness was ±2.13%. These values were substantially equal to those obtained in the case of using the conventional film-forming apparatus. In a similar manner, the average value of the seat resistances of the wafers and the degree of variations in average seat resistance were calculated. As a result, the average value was 70.76 Ω/seat, and the degree of variations was ±8.83%. These values were also substantially equal to those in the conventional case. These results indicate that the use of the main and sub dopant gas introduction pipes, in accordance with the present invention does not adversely affect the. film-forming treatment of wafers.

Figure 5:
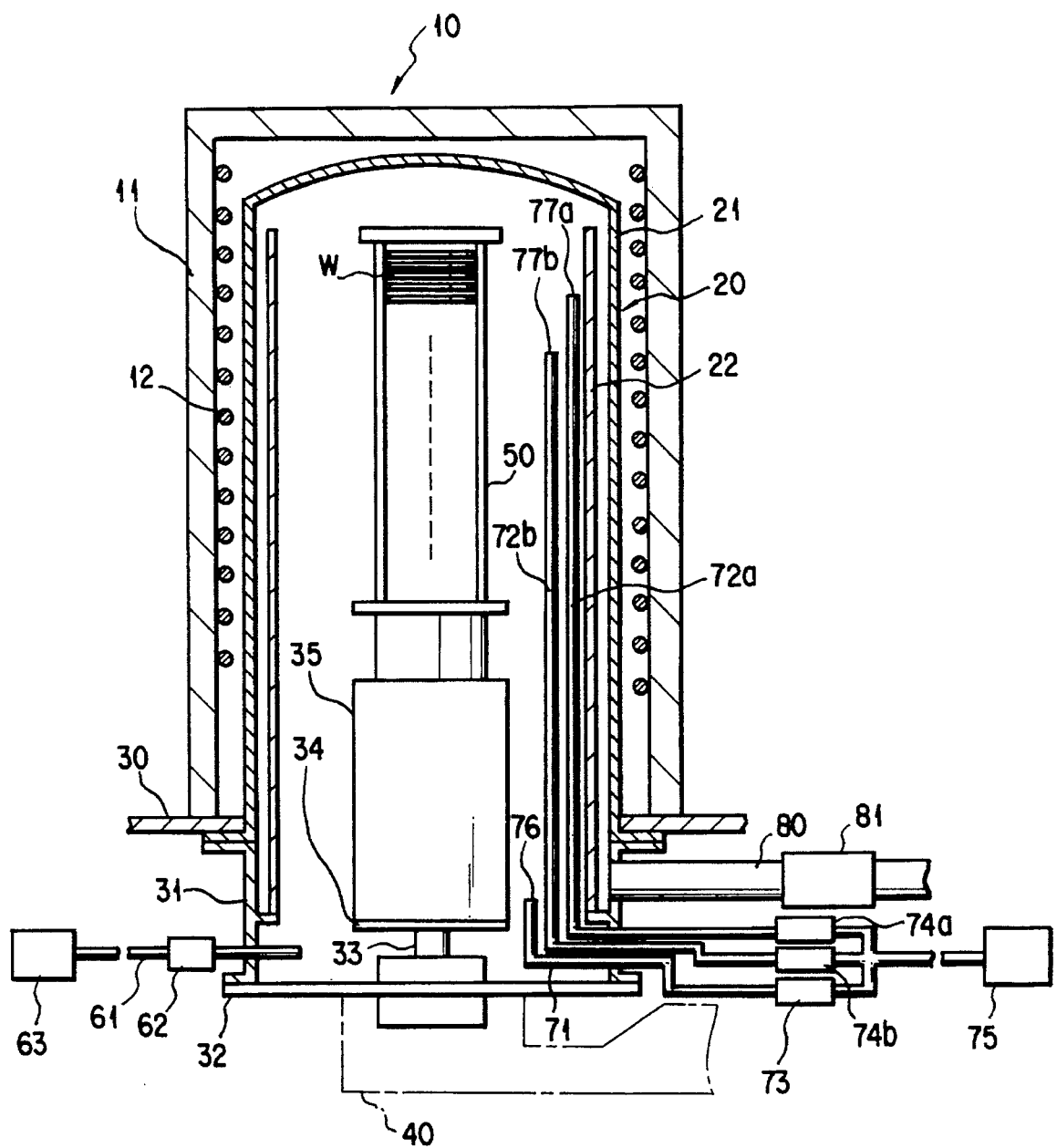
FIG. 5 is a cross sectional view, showing a film-forming apparatus according to another aspect of the invention.

Another aspect of the invention will now be explained with reference to FIG. 5. This case has substantially the same structure as above except that two sub dopant gas introduction pipes are employed. More specifically, a main dopant gas introduction pipe 71 and sub dopant gas introduction pipes 72a and 72b are inserted through a lower side portion of the manifold 31 for introducing into the reaction tube 20 a mixture of a dopant gas such as phosphin ($PH_3$) gas and a carrier gas such as helium gas. These main and sub dopant gas introduction pipes 71, 72a and 72b are connected to a common gas supply source 75 via mass-flow controllers 73, 74a and 74b, respectively.

The sub dopant gas introduction pipes 72a and 72b are L-shaped such that their gas outlets 77a and 77b open at upper portions of the reaction tube 20 in which upper ones of wafers W are placed. The gas outlet 77a opens at a higher location than the gas outlet 77b.

Sine in the above structure, the dopant gas introduced through the two sub dopant gas introduction pipes 72a and 72b compensates the dopant gas through the main dopant gas introduction pipe 71, a more uniform dopant gas concentration can be obtained in the longitudinal direction of the reaction tube 20, and accordingly the thin films of wafers can have a more uniform phosphorus concentration.

The impurity implanted in the thin film is not limited to phosphorus, but may be boron (in this case, $B_2H_6$ gas is used). Further, the object to be processed is not limited to a semiconductor wafer, but may be a glass substrate as used in a step of manufacturing a liquid crystal panel. Moreover, although in the above-described embodiments, the vertical heat processing apparatus has been explained, the invention is applicable also to a horizontal apparatus. Although in the embodiments, one or two sub dopant gas introduction pipes are employed, three or more sub dopant gas introduction pipes may be employed.

It is needless to say that the invention can be modified in various manners other than the above, without departing from its scope.

We claim:

1. A film-forming apparatus comprising:
   an elongated reaction tube having an object arrangement region in which a plurality of objects to be processed can be arranged in a longitudinal direction of said tube;
   a film-forming gas introduction pipe for introducing a film-forming gas into said reaction tube;
   a main dopant gas introduction pipe, having a gas outlet located in said reaction tube closer to a longitudinal end of the reaction tube than the object arrangement region, for introducing a dopant gas into the reaction tube and guiding the dopant gas toward another longitudinal end of the reaction tube;
   at least one sub dopant gas introduction pipe having a gas outlet located in said reaction tube closer to said another longitudinal end of said reaction tube than said gas outlet of said main dopant gas introduction pipe, for introducing the same dopant gas as the first-mentioned dopant gas into the reaction tube so as to compensate supply of said dopant gas through said main dopant gas introduction pipe;
   exhaustion means for exhausting the gases in said reaction tube; and
   heating means for heating an interior of said reaction tube;
   wherein a film doped with an impurity is formed on each of said objects.

2. The film-forming apparatus according to claim 1, wherein said at least one sub dopant gas introduction pipe comprises two sub dopant gas introduction pipes having respective gas outlets located at longitudinally different portions of the reaction tube.

3. The film-forming apparatus according to claim 1, wherein said reaction tube is located such that the longitudinal direction is identical to the vertical direction, and said object to be processed are arranged in a vertical direction at intervals.

4. The film-forming apparatus according to claim 3, wherein said main and sub dopant gas introduction pipes have respective vertical portions in said reaction tube, and said gas outlets are respectively formed in said vertical portions for guiding the dopant gas upward.

5. The film-forming apparatus according to claim 1, wherein said gas outlet of the at least one sub dopant gas introduction pipe is located corresponding to said object arrangement region.

6. The film forming apparatus according to claim 1, wherein the dopant gas contains phosphor.

7. A film-forming apparatus comprising:
   an elongated reaction tube located such that its longitudinal direction is identical to a vertical direction, and having an object arrangement region in which a plurality of objects to be processed can be arranged at intervals in the vertical direction;
   a film-forming gas introduction pipe for introducing a film-forming gas into the reaction tube;
   a main dopant gas introduction pipe, having a gas outlet located below said object arrangement region in said reaction tube, for introducing a dopant gas into said reaction tube and guiding the dopant gas upward;
   at least one sub dopant gas introduction pipe, having a gas outlet located above said object arrangement region in said reaction tube, for introducing the same dopant gas as the first-mentioned dopant gas into said reaction tube so as to compensate supply of the dopant gas through said main dopant gas introduction pipe;
   exhaustion means for exhausting the gases in said reaction tube; and
   heating means for heating the interior of said reaction tube;
   wherein a film doped with an impurity is formed on each of said objects.

8. The film-forming apparatus according to claim 7, wherein said at least one sub dopant gas introduction pipe comprises two sub dopant gas introduction pipes having respective gas outlets located at longitudinally different portions of the reaction tube.

9. The film-forming apparatus according to claim 7, wherein said gas outlet of the at least one sub dopant gas introduction pipe is located corresponding to said object arrangement region.

10. The film forming apparatus according to claim 7, wherein the dopant gas contains phosphor.

* * * * *